(12) United States Patent
Girardey et al.

(10) Patent No.: US 11,740,149 B2
(45) Date of Patent: Aug. 29, 2023

(54) MEASURING DEVICE WITH A SENSOR ELEMENT AND A MEASUREMENT AND OPERATION CIRCUIT

(71) Applicant: Endress+Hauser SE+Co. KG, Maulburg (DE)

(72) Inventors: Romuald Girardey, Blotzheim (FR); Nils Ponath, Lörrach (DE); Alexander Bannwarth, Schwörstadt (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 114 days.

(21) Appl. No.: 17/310,812

(22) PCT Filed: Jan. 23, 2020

(86) PCT No.: PCT/EP2020/051626
§ 371 (c)(1),
(2) Date: Aug. 25, 2021

(87) PCT Pub. No.: WO2020/173624
PCT Pub. Date: Sep. 3, 2020

(65) Prior Publication Data
US 2022/0155167 A1    May 19, 2022

(30) Foreign Application Priority Data
Feb. 26, 2019    (DE) .................. 10 2019 104 841.9

(51) Int. Cl.
*G01L 9/00* (2006.01)
*G01L 9/12* (2006.01)
(Continued)

(52) U.S. Cl.
CPC ........ *G01L 9/0072* (2013.01); *G01L 19/0069* (2013.01); *G01L 19/04* (2013.01)

(58) Field of Classification Search
CPC . G01L 9/00; G01L 9/0072; G01L 9/12; G01L 19/00; G01L 19/0069; G01L 19/04
See application file for complete search history.

(56) References Cited

U.S. PATENT DOCUMENTS

| 7,353,711 B2* | 4/2008 | O'Dowd | G01L 13/025 73/753 |
| 8,516,892 B2* | 8/2013 | Yamamoto | G01L 19/148 73/715 |

(Continued)

FOREIGN PATENT DOCUMENTS

| CN | 1929994 A | 3/2007 |
| CN | 101252125 A | 8/2008 |

(Continued)

*Primary Examiner* — Nguyen Q. Ha
(74) *Attorney, Agent, or Firm* — Kelly J. Smith; Endress+Hauser (USA) Holding, Inc.

(57) ABSTRACT

The measuring device comprises a sensor element with an electrical transducer for providing a primary signal dependent on the measured variable and a sensor body with a flat surface portion. The measuring device also includes a measurement and operation circuit for driving the transducer and processing the primary signals. The measurement and operation circuit comprises at least one carrier, a plurality of circuit components including at least one integrated circuit, and passive components. The carrier comprises an electrically insulating carrier body and conductor paths which extend in the carrier body or on its surface. The integrated circuit and the passive component are arranged on the carrier body surface and contacted by the conductor paths. The carrier body is fixed to the surface portion, and the transducer is electrically connected to circuit components of the measurement and operation circuit via conductor paths, the components being encapsulated with a molding compound.

8 Claims, 1 Drawing Sheet

(51) Int. Cl.
*G01L 19/00* (2006.01)
*G01L 19/04* (2006.01)

(56) References Cited

U.S. PATENT DOCUMENTS

| | | |
|---|---|---|
| 2005/0277227 A1 | 12/2005 | Shim et al. |
| 2008/0022762 A1* | 1/2008 | Skurnik .................. G01L 9/12 |
| | | 73/146.5 |
| 2009/0236733 A1 | 9/2009 | Chow et al. |
| 2015/0362392 A1 | 12/2015 | Tanida et al. |

FOREIGN PATENT DOCUMENTS

| | | |
|---|---|---|
| CN | 102640285 A | 8/2012 |
| CN | 103426869 A | 12/2013 |
| CN | 103426869 B | 12/2013 |
| CN | 103992100 A | 8/2014 |
| CN | 104284777 A | 1/2015 |
| CN | 106003935 A | 10/2016 |
| DE | 19828598 A1 | 2/1999 |
| DE | 10223946 A1 | 12/2002 |
| DE | 10135568 A1 | 2/2003 |
| DE | 10200780 A1 | 7/2003 |
| DE | 10326975 A1 | 1/2005 |
| DE | 102006035274 A1 | 2/2008 |
| DE | 102008054987 A1 | 6/2010 |
| DE | 102012222239 A1 | 6/2014 |
| EP | 1063504 A1 | 12/2000 |
| EP | 1126259 A1 | 8/2001 |
| JP | 57206842 A | 12/1982 |
| WO | 2015039811 A1 | 3/2015 |

\* cited by examiner

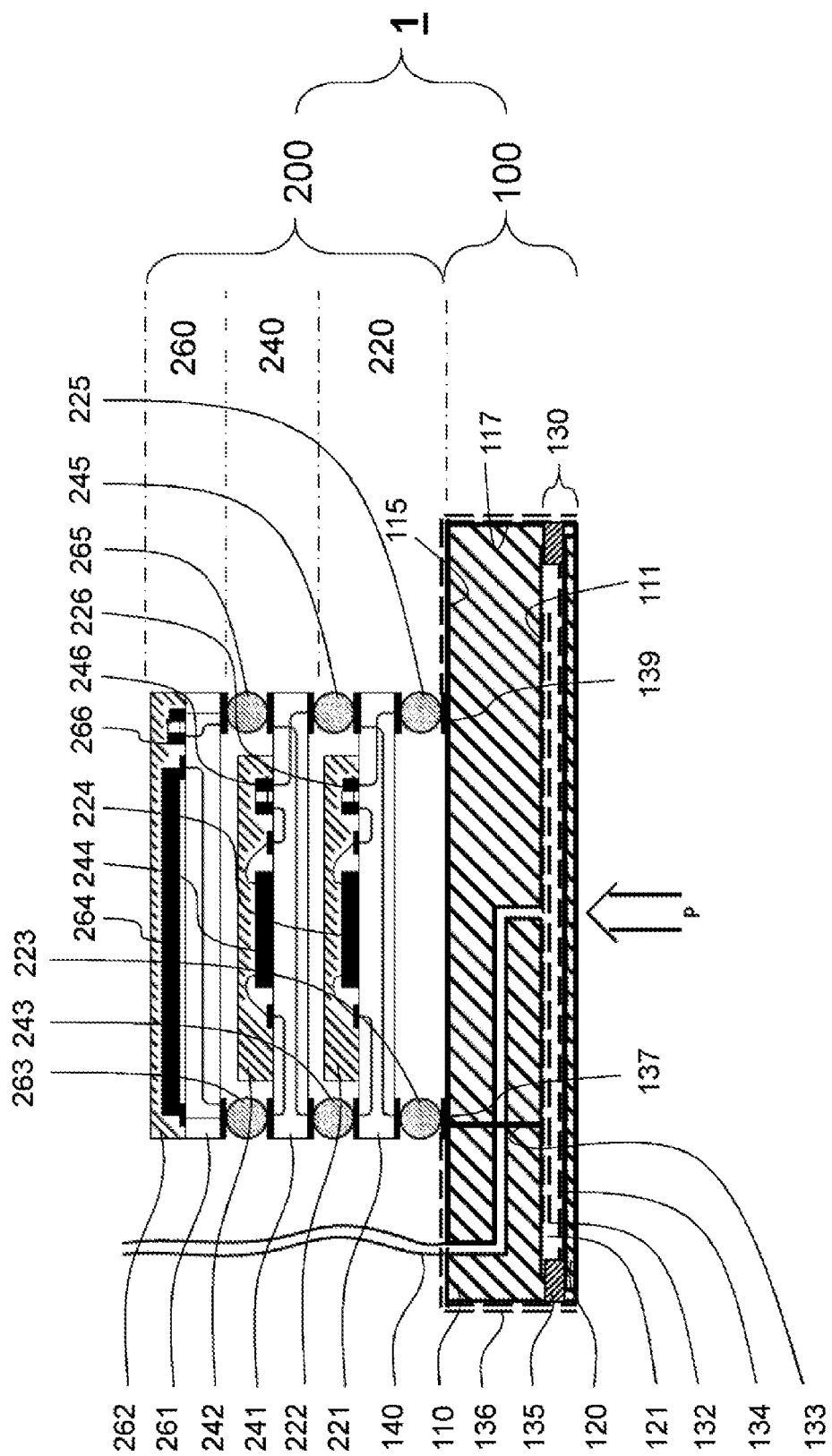

MEASURING DEVICE WITH A SENSOR ELEMENT AND A MEASUREMENT AND OPERATION CIRCUIT

CROSS-REFERENCE TO RELATED APPLICATIONS

The present application is related to and claims the priority benefit of German Patent Application No. 10 2019 104 841.9, filed on Feb. 26, 2019 and International Patent Application No. PCT/EP2020/051626, filed on Jan. 23, 2020, the entire contents of which are incorporated herein by reference.

TECHNICAL FIELD

The present invention relates to a measuring device comprising a sensor element and a measuring and operating circuit. A generic measuring device comprises: a sensor element for detecting a measured variable, wherein the sensor element comprises an electrical transducer for providing a primary electrical signal dependent on the measured variable, and a sensor body including at least one flat surface section; a measuring and operating circuit for driving the electrical transducer and for processing the signals provided by the electrical transducer, wherein the measuring and operating circuit comprises at least one carrier, and a plurality of circuit components, encompassing at least one integrated circuit and at least one discrete, passive electrical component, wherein the carrier comprises an electrically insulating carrier body and conductor tracks, which run in the carrier body and/or on at least one carrier body surface, wherein the integrated circuit and the passive electrical component are arranged on the carrier body surface and are contacted by the conductor tracks. The primary signals are to be supplied to the measuring and operating circuit in as undistorted a form as possible, in order to achieve a conversion into more robust signals that are less sensitive to disturbance variables and environmental influences such as temperature and moisture. For this purpose, the measuring and operating circuit is arranged on the sensor body close to the transducer.

BACKGROUND

Published patent application DE 101 35 568 A1 discloses a pressure measuring device comprising a sensor element, on the rear side of which a measuring and operating circuit is arranged and covered by a metallic cap. The cap is joined in a hermetically sealed manner to the sensor body of the sensor element along a circumferential joint in the edge region of the sensor body by means of an active brazing solder. This is a very complex manufacturing process, which exposes the circuit during production to a high thermal load and can lead to considerable thermomechanical stresses and hysteresis due to the design.

Published patent application DE 102 00 780 A1 discloses a pressure measuring device comprising a ceramic sensor body and a ceramic pot, which is arranged on the rear side of the sensor body and closed by the sensor body. A measuring and operating circuit is enclosed in the pot. At the same time, the pot is used to support the sensor body on the rear side, i.e., it is a mechanically determining component of the pressure measuring device. It is particularly complex to achieve a hermetically sealed connection on the one hand, and a hysteresis-free connection between the pot and the sensor body on the other hand.

The published patent application DE 103 26 975 A1 discloses a pressure measuring device comprising a pressure sensor element, which comprises a capacitive transducer, and further comprising a measuring and operating circuit, which is arranged in a hermetically sealed capsule on a rear surface of a sensor body of the pressure measurement cell. The hermetically sealed capsule comprises a ceramic or metallic material and is held at a distance from the rear surface of the sensor body by way of a central support or connecting wires. The connecting wires form a moisture-dependent parasitic capacitance, wherein hydrophobation of the connecting wires is intended to reduce the moisture dependence.

Published patent application DE 10 2008 054 97 A1 discloses a pressure measuring device comprising a pressure sensor element, onto the rear side of which a housing for encapsulating a measuring and operating circuit is soldered. In the housing, the measuring and operating circuit is connected to the capacitive transducer of the pressure sensor element via bonding wires before the housing is closed with a cover to be soldered to the housing. The design is very complex and requires a comparatively large housing base surface, since bonding wires still have to be guided within the housing from a free region of a rear sensor surface to the measuring and operating circuit. This is expensive and reduces the remaining surface on the rear side of the sensor body on which the sensor element can be supported. In addition, with differing coefficients of thermal expansion of the housing, the sensor body, and the solder material between the housing and the sensor body, a large housing base surface can cause more extensive thermomechanical stresses in the sensor body, which result in temperature hysteresis.

SUMMARY

It is therefore the object of the present invention to provide a measuring device which, on the one hand, is not sensitive to moist conditions and, on the other hand, reduces the influence of thermomechanical stresses on the measuring device. The object is achieved by the measuring device according to independent claim 1.

The measuring device according to the invention comprises: a sensor element for detecting a measured variable, wherein the sensor element comprises an electrical transducer for providing for providing measured variable-dependent primary electrical signals, and a sensor body including at least one flat surface section; a measuring and operating circuit for driving the electrical transducer and for processing the primary signals provided by the electrical transducer (130), wherein the measuring and operating circuit comprises at least one carrier, and a plurality of circuit components, encompassing at least one integrated circuit and at least one discrete, passive electrical component, wherein the carrier comprises an electrically insulating carrier body and conductor tracks, which run in the carrier body and/or on at least one carrier body surface, wherein the integrated circuit and the passive electrical component are arranged on the carrier body surface and are contacted by the conductor tracks; wherein, according to the invention, the carrier body is fixed to the surface section, and the transducer is electrically connected to circuit components of the measuring and operating circuit via conductor tracks, wherein the components arranged on the carrier body are encapsulated with a molding compound, especially, by being insert-molded with the molding compound.

By encapsulating the components of the measuring and operating circuit on a carrier body, the components are sufficiently protected against moisture.

The measuring and operating circuit preferably comprises an analog-to-digital converter, which digitizes the primary signals at an early stage of the processing chain so that the further signal processing is largely insensitive to moist conditions.

In a refinement of the invention, the carrier body is connected to terminal contacts of the transducer in the surface section by means of a ball grid array.

The connection of the carrier body to terminal contacts of the transducer via a ball grid array results in extremely short exposed electrical connections between the sensor body and the carrier body. The electrical connections which are directly exposed to the influence of moisture are thus considerably reduced.

In a refinement of the invention, the housing, together with the carrier, forms a so-called chip-scale package. This technical term originating from the English, which is however also customary in German, denotes further miniaturization than is possible using conventional FR-based printed circuit boards. The distance between contact points, for example in the form of a ball grid array, by way of which the carrier is mounted on a substrate and/or connected to contacts, is, for example, no more than 2 mm, especially, no more than 1 mm.

In a refinement of the invention, an orthogonal projection of the measuring and operating circuit covers no more than 60%, especially, no more than 50%, of the second end face.

The sensor body can, especially, comprise a ceramic material, such as corundum, or a metallic material, such as stainless steel. Although significant differences then exist in the coefficients of thermal expansion, the base surface of the carrier body is comparatively small due to the increased integration of the measuring and operating circuit in the chip-scale package, so that the impact of the differing coefficients of thermal expansion on the measuring accuracy is comparatively small.

In a refinement of the invention, the carrier body comprises a composite material including a matrix made of plastic, for example a fiber-reinforced plastic, wherein the plastic includes, especially, bismaleimide triazine (BT) or a polyimide, and wherein the fibers comprise, for example, glass, ceramic, such as Al2O3, and combinations of glass or ceramic with a plastic, such as polyimide. In a refinement of the invention, the carrier body has a laminate structure.

In a refinement of the invention, the sensor body comprises a first material having a first coefficient of thermal expansion in the area of the surface section, and wherein the carrier body comprises a second material having a second coefficient of thermal expansion, wherein the coefficients of thermal expansion deviate from each other by more than 20 ppm/K, so that a temperature change leads to differing longitudinal expansions that bring about a deformation of the sensor body in the area of the surface section and a deformation of the carrier body, wherein the deformation energy of the carrier body is at least ten times, especially, at least twenty times, and preferably at least forty times, the deformation energy of the sensor body.

An effective modulus of elasticity of approximately 4 GPa for the carrier body can be achieved by a suitable material selection for the carrier body, for example a matrix made of bismaleimide triazine (BT) including embedded fibers. This is approximately 1% of the modulus of elasticity of a high-purity corundum material used for the base body of a sensor body. In this material pairing, a majority of the deformation energy for compensating for differences in thermal expansion is absorbed by the carrier body, so that the measurement accuracy is not impaired by excessive deformation of the sensor body.

In a refinement of the invention, the measuring and operating circuit comprises a plurality of carriers, which are stacked on top of one another and are each connected to an adjacent one of the carriers via a ball grid array.

By stacking a plurality of carriers, the functionality of the measuring and operating circuit can be considerably expanded with the same base surface thereof, so that main electronics customary in measuring devices can possibly be dispensed with, which are otherwise provided for further signal processing and signal communication.

In a refinement of the invention, the integrated circuit is configured to calculate a value representing the measured variable based on a transfer function and the digitized primary signal.

In a refinement of the invention, the measuring and operating circuit comprises a microprocessor, which is configured to process a value representing the measured variable into a signal according to an automation technology communication protocol, especially, a field bus protocol, e.g., a protocol according to Foundation Fieldbus, Profibus, HART or a radio protocol.

In a refinement of the invention, the integrated circuit is arranged on a first carrier, and the microprocessor is arranged on a second carrier.

In a refinement of the invention, the measuring and operating circuit further comprises an energy store, especially, a GoldCap, a rechargeable battery or a battery.

In a refinement of the invention, the energy store is arranged on a different carrier than the integrated circuit.

In a refinement of the invention, the sensor element comprises a pressure sensor element.

In a refinement of the invention, the pressure sensor element comprises a measuring membrane, wherein the sensor body comprises a counter body, which is cylindrical at least in sections, wherein the measuring membrane is connected to the counter body in a pressure-tight manner at a first end face of the counter body, and wherein the measuring and operating circuit is arranged on a surface section of a second end face facing away from the measuring membrane.

In a refinement of the invention, the pressure sensor element comprises a capacitive measuring transducer, which comprises at least one first electrode arranged on the measuring membrane and at least one second electrode arranged on the counter body, which electrodes face each other, wherein the capacitance between the first and second electrodes depends on a pressure-dependent deflection of the measuring membrane, wherein at least the second electrode is connected to the measuring and operating circuit via at least one feedthrough through the counter body. Instead of the capacitive transducer, a (piezo) resistive transducer can likewise be used.

Although the invention is explained here, especially, in connection with pressure sensors, it likewise relates to sensor elements for other measured variables and monitoring variables of industrial process metrology, such as the fill level, limit level, flow, temperature, flow rate, density viscosity moisture, pH value, electrical conductivity, or composition of a substance mixture.

BRIEF DESCRIPTION OF THE DRAWING

The invention will now be explained in more detail based on the exemplary embodiment shown in the drawing. The following is shown:

FIG. 1 shows a schematic longitudinal section through an exemplary embodiment of a measuring device according to the present disclosure.

DETAILED DESCRIPTION

The exemplary embodiment of a measuring device according to the invention shown in FIG. 1 is a pressure measuring device 1, which comprises a pressure sensor element 100 and a measuring and operating circuit 200.

The pressure sensor element 100 comprises a cylindrical, ceramic counter body 110 and a ceramic measuring membrane 120, which is connected to a first end face 111 of the counter body 110 by means of a circumferential conductive joint 135, which includes an active brazing solder, forming a measuring chamber 121. The pressure sensor element 100 also comprises a capacitive transducer 130, which includes at least one measuring electrode 132 on the first end face 111 of the counter body 110 and a membrane electrode 134 on a surface of the measuring membrane 120 facing the counter body 110.

The measuring electrode 132 is galvanically connected via an electrical feedthrough 133 to a first contact point 137, formed by a metal layer, on a second end face 115 of the counter body 110. The membrane electrode 134 is galvanically connected to a second contact point 139, formed by a metal layer, via the joint 135 and a metallic coating 136 of an outer surface 117 and portions of the second end face 115 of the counter body 110.

A reference pressure channel 140, which opens into the measuring chamber 121, extends through the counter body 110, so that a reference pressure can be applied to the measuring chamber 121. The measuring membrane 120 accordingly experiences a deflection that depends on a difference between a pressure p on the outside of the measuring membrane 120 and the reference pressure in the measuring chamber 121. This deflection is detected by means of the capacitive transducer 130, which is connected to the measuring and operating circuit 200. In the illustration of this exemplary embodiment, the capacitive transducer 130 comprises only one electrode on the counter body side, namely the measuring electrode 132; in fact, electrodes can also be arranged on the counter body, namely a central measuring electrode having a capacitance CP to the membrane electrode 134, and a reference electrode that has a capacitance CR to the membrane electrode and surrounds the measuring electrode in an annular manner and that, in the rest position of the measuring membrane, has the same capacitance. The transfer function of such a capacitive transducer comprising a differential capacitor is proportional to (CP-CR)/CP in a first approximation.

In the exemplary embodiment shown here, the measuring and operating circuit 200 comprises a stack of integrated encapsulated systems 220, 240, 260, so-called system-in-a-package arrays 220, 240, 260, which are referred to below as SIP. Although three SIP 220, 240, 260 are provided here, the invention is also implemented by a measuring device having only a first SIP 220.

The first SIP 220 comprises a carrier body 221, which comprises a laminate made of a plurality of layers of a fiber-reinforced plastic, for example a plastic matrix made of bismaleimide triazine, in which fibers, for example polyimide fibers, are embedded, which in turn may include a glass coating or ceramic coating. Conductor tracks are prepared between the layers and through the layers of the laminate structure in order to contact the components of the first SIP 220 so as to connect them to each other and to the capacitive transducer 130 of the sensor element 100. The carrier body is fixedly connected to the second end face 115 of the counter body 110 by way of a ball grid array, wherein a first solder ball 223 of the ball grid array is galvanically connected to the first contact point 137, and wherein a second solder ball 225 is galvanically connected to the second contact point 139 in order to connect the electrodes of the capacitive transducer 130 to the first SIP 220 the measuring and operating circuit 200. Although only two contacts are shown in the drawing, in fact a plurality of contacts can be present, especially, at least three contacts, namely for CP, CR and the measuring membrane. The first SIP 220 comprises an ASIC 224, which is arranged on the carrier body 221 and is configured to digitize primary signals of the capacitive transducer and to provide a pressure measurement value as a function of the digitized values based on a transfer function. The first SIP 220 furthermore comprises passive components 226, especially, resistance elements and capacitors, which are arranged on the carrier body 224 adjacent to the ASIC 224 and are configured to provide a stable supply voltage for the ASIC. The ASIC 224 and the passive components 226 are encapsulated on the carrier body 221 with a molding compound 222 by means of injection molding. The molding compound can, especially, comprise epoxy resin. On the upper side of the carrier body 221 facing away from the sensor element 110, further contact points to which signal paths and the electrical supply of the first SIP 220 are to be connected are arranged outside the capsule, formed by the molding compound 222, with the encapsulated components 224, 226.

In the exemplary embodiment, a second SIP 240 is fastened to these contact points by way of a second ball grid array, the solder balls 243 and 245 of which are shown in the drawing; in fact, significantly more contacts are present here in order to enable the data exchange between the SIP 220, 240 and the power supply of the first SIP 220. The second SIP 240 likewise comprises a carrier body 241 and components 244, 246 of the measuring and operating circuit 200 encapsulated with molding compound 242. The components 244, 246 can comprise a voltage regulator module 246 and a microcontroller for the wireless HART protocol 244 for communicating with a control system of the process automation technology, especially, for measured value transmission, and/or a microcontroller for the Bluetooth protocol for measured value transmission and/or parameterization of the measuring and operating circuit 200. On the upper side of the second carrier body 241 facing away from the sensor element 110, the second SIP 240, outside the capsule formed by the molding compound 242, includes further contact points to which signal paths and the electrical supply of the first and second SIP 220, 240 are to be connected.

In the exemplary embodiment, a third SIP 260 is fastened to these contact points by way of a third ball grid array, the solder balls 263 and 265 of which are shown in the drawing; in fact, significantly more contacts are present here in order to enable the data exchange between the SIP and the power supply of the first and second SIP 220, 240. The third SIP 260 likewise comprises a carrier body 261, and components 264, 266 of the measuring and operating circuit encapsulated with molding compound 262 here comprise a battery 264 for supplying power to the measuring and operating circuit 200 and an antenna module 266 for communicating with a control system or an operating tool via Wireless HART or Bluetooth.

The materials of the carrier bodies 241, 261 and of the molding compounds 242, 262 of the second SIP 240 and of the third SIP 260 can, especially, be the same materials as those of the carrier body 221 or of the molding compounds of the first SIP 220.

The invention claimed is:

1. A measuring device, comprising:
a sensor element for detecting a measured variable, wherein the sensor element comprises an electrical transducer for providing measured variable-dependent primary electrical signals and a sensor body including at least one flat surface section;
a measuring and operating circuit for driving the electrical transducer and for processing the electrical signals provided by the electrical transducer, wherein the measuring and operating circuit comprises at least one carrier, and a plurality of circuit components, wherein the plurality of circuit components encompass at least one integrated circuit and at least one discrete, passive electrical component,
the carrier comprising an electrically insulating carrier body and conductor tracks, which run in the carrier body and/or on at least one carrier body surface,
the integrated circuit and the passive electrical component being arranged on the carrier body surface and contacted by the conductor tracks;
wherein
the at least one carrier body is fixed to the surface section, and
the transducer is electrically connected to circuit components of the measuring and operating circuit via conductor tracks,
the components arranged on the carrier body being encapsulated with a molding compound,
the measuring and operating circuit comprises a plurality of carriers, which are stacked on top of one another and are each connected to an adjacent one of the carriers via a ball grid array.

2. The measuring device according to claim 1, wherein the measuring and operating circuit comprises a microprocessor, which is configured to process a value representing the measured variable into a signal according to an automation technology communication protocol.

3. The measuring device according to claim 2, wherein the integrated circuit is arranged on a first carrier, and the microprocessor is arranged on a second carrier.

4. The measuring device according to claim 1, wherein the measuring and operating circuit further comprises an energy store.

5. The measuring device according to claim 4, wherein the energy store is arranged on a different carrier than the integrated circuit.

6. A measuring device, comprising:
a sensor element for detecting a measured variable, wherein the sensor element comprises an electrical transducer for providing measured variable-dependent primary electrical signals and a sensor body including at least one flat surface section;
a measuring and operating circuit for driving the electrical transducer and for processing the primary electrical signals provided by the electrical transducer, wherein the measuring and operating circuit comprises at least one carrier, and a plurality of circuit components, wherein the plurality of circuit components encompass at least one integrated circuit and at least one discrete, passive electrical component,
the carrier comprising an electrically insulating carrier body and conductor tracks, which run in the carrier body and/or on at least one carrier body surface,
the integrated circuit and the passive electrical component being arranged on the carrier body surface and contacted by the conductor tracks;
wherein
the at least one carrier body is fixed to the surface section, and
the transducer is electrically connected to circuit components of the measuring and operating circuit via conductor tracks,
the components arranged on the carrier body being encapsulated with a molding compound,
the sensor element comprises a pressure sensor element,
the pressure sensor element comprises a measuring membrane, the sensor body comprising a counter body, which is cylindrical at least in sections, the measuring membrane being connected to the counter body in a pressure-tight manner at a first end face of the counter body, and the measuring and operating circuit being arranged on a surface section of a second end face facing away from the measuring membrane, and
an orthogonal projection of the measuring and operating circuit covers no more than 60% of the second end face.

7. The measuring device according to claim 6, wherein the pressure sensor element comprises a capacitive measuring transducer, which comprises at least one first electrode arranged on the measuring membrane and at least one second electrode arranged on the counter body, which electrodes face each other, the capacitance between the first and second electrodes depending on a pressure-dependent deflection of the measuring membrane, at least the second electrode being connected to the measuring and operating circuit via at least one feedthrough through the counter body.

8. A measuring device, comprising:
a sensor element for detecting a measured variable, wherein the sensor element comprises an electrical transducer for providing measured variable-dependent primary electrical signals and a sensor body including at least one flat surface section;
a measuring and operating circuit for driving the electrical transducer and for processing the primary electrical signals provided by the electrical transducer, wherein the measuring and operating circuit comprises at least one carrier, and a plurality of circuit components, wherein the plurality of circuit components encompass at least one integrated circuit and at least one discrete, passive electrical component,
the carrier comprising an electrically insulating carrier body and conductor tracks, which run in the carrier body and/or on at least one carrier body surface,
the integrated circuit and the passive electrical component being arranged on the carrier body surface and contacted by the conductor tracks;
wherein
the at least one carrier body is fixed to the surface section, and
the transducer is electrically connected to circuit components of the measuring and operating circuit via conductor tracks,
the components arranged on the carrier body being encapsulated with a molding compound,
the sensor body comprises a first material having a first coefficient of thermal expansion in the area of the surface section, and the carrier body comprises a second material having a second coefficient of thermal expansion, wherein the coefficients of thermal expansion deviate from each other by more than 20 ppm/K, so that a temperature change leads to differing longitudinal expansions that bring about a deformation of the sensor body in the area of the surface section and a deformation of the carrier body, the deformation energy of the carrier body being at least ten times the deformation energy of the sensor body.

* * * * *